(12) United States Patent
Huang et al.

(10) Patent No.: US 7,923,759 B2
(45) Date of Patent: Apr. 12, 2011

(54) METAL GATE SEMICONDUCTOR DEVICE AND MANUFACTURING METHOD

(75) Inventors: Chien-Chao Huang, Hsin-Chu (TW);
Kuang-Hsin Chen, Jung-Li (TW);
Fu-Liang Yang, Hsin-Chu (TW)

(73) Assignee: Taiwan Semiconductor Manufacuturing Company, Ltd., Hsin-Chu (TW)

( * ) Notice: Subject to any disclaimer, the term of this patent is extended or adjusted under 35 U.S.C. 154(b) by 936 days.

(21) Appl. No.: 11/400,853

(22) Filed: Apr. 10, 2006

(65) Prior Publication Data
US 2006/0202237 A1 Sep. 14, 2006

Related U.S. Application Data

(62) Division of application No. 10/810,950, filed on Mar. 25, 2004, now abandoned.

(51) Int. Cl.
*H01L 29/768* (2006.01)

(52) U.S. Cl. . 257/250; 257/388; 257/412; 257/E29.156; 438/302

(58) Field of Classification Search .................. 257/250, 257/296, 388, 412, 413, E29.156; 438/302
See application file for complete search history.

(56) References Cited

U.S. PATENT DOCUMENTS

| | | | | |
|---|---|---|---|---|
| 5,153,145 A | * | 10/1992 | Lee et al. | 438/305 |
| 6,096,595 A | * | 8/2000 | Huang | 438/238 |
| 6,130,123 A | * | 10/2000 | Liang et al. | 438/217 |
| 6,136,636 A | * | 10/2000 | Wu | 438/231 |
| 6,355,531 B1 | * | 3/2002 | Mandelman et al. | 438/276 |
| 6,436,749 B1 | * | 8/2002 | Tonti et al. | 438/199 |
| 6,583,013 B1 | * | 6/2003 | Rodder et al. | 438/276 |
| 6,689,688 B2 | | 2/2004 | Besser et al. | |
| 6,696,346 B2 | | 2/2004 | Hayashizaki | |
| 6,699,755 B1 | | 3/2004 | Chiou et al. | |
| 6,723,658 B2 | * | 4/2004 | Eissa et al. | 438/745 |
| 6,908,850 B2 | * | 6/2005 | Doris et al. | 438/630 |
| 6,929,992 B1 | * | 8/2005 | Djomehri et al. | 438/199 |
| 2004/0224451 A1 | | 11/2004 | Chen et al. | |
| 2005/0212015 A1 | | 9/2005 | Huang et al. | |

FOREIGN PATENT DOCUMENTS

| | | |
|---|---|---|
| CN | 1551333 A | 12/2004 |
| CN | 2742580 Y | 11/2005 |

\* cited by examiner

*Primary Examiner* — Thinh T Nguyen
(74) *Attorney, Agent, or Firm* — Haynes and Boone, LLP

(57) ABSTRACT

A method for manufacturing a metal gate includes providing a substrate including a gate electrode located on the substrate. A plurality of layers is formed, including a first layer located on the substrate and the gate electrode and a second layer adjacent the first layer. The layers are etched to form a plurality of adjacent spacers, including a first spacer located on the substrate and adjacent the gate electrode and a second spacer adjacent the first spacer. The first spacer is then etched and a metal layer is formed on the device immediately adjacent to the gate electrode. The metal layer is then reacted with the gate electrode to form a metal gate.

20 Claims, 6 Drawing Sheets

US 7,923,759 B2

METAL GATE SEMICONDUCTOR DEVICE AND MANUFACTURING METHOD

This application is a division of U.S. Ser. No. 10/810,950 filed Mar. 25, 2004.

BACKGROUND

This disclosure relates generally to semiconductor manufacturing, and more particularly to a method for manufacturing a metal gate.

A gate dielectric integrity of metal-oxide-semiconductor field effect transistor (MOSFET) is associated with reliability and lifetime of MOSFET devices. As the gate dielectric thickness is reduced in technology scaling-down, gate leakage is induced, increasing power consumption and reducing device performance.

High K materials, which include materials with K values larger than approximately 5, such as SiON, $HfO_xSi_y$, or $HfO_2$, are implemented to realize thicker gate dielectric layers for minimized leakage current and equivalent oxide thickness (EOT). Also, a metal gate electrode can be used to reduce gate resistance. In addition, the metal gate can also reduce gate leakage that is induced by boron penetration from polysilicon gate electrodes.

On metal gate formation, problems include many processing issues such as chemical mechanical polishing ending point detection, spacer and liner loss, and poly gate loss. On source and drain contact formation, problems include shallow trench isolation loss and spacer oxide liner loss. In general, the process involves complex steps that increase cost.

Accordingly, it would be desirable to provide an improved method for manufacturing a metal gate absent the disadvantages found in the prior methods discussed above.

DETAILED DESCRIPTION

Figure 1:
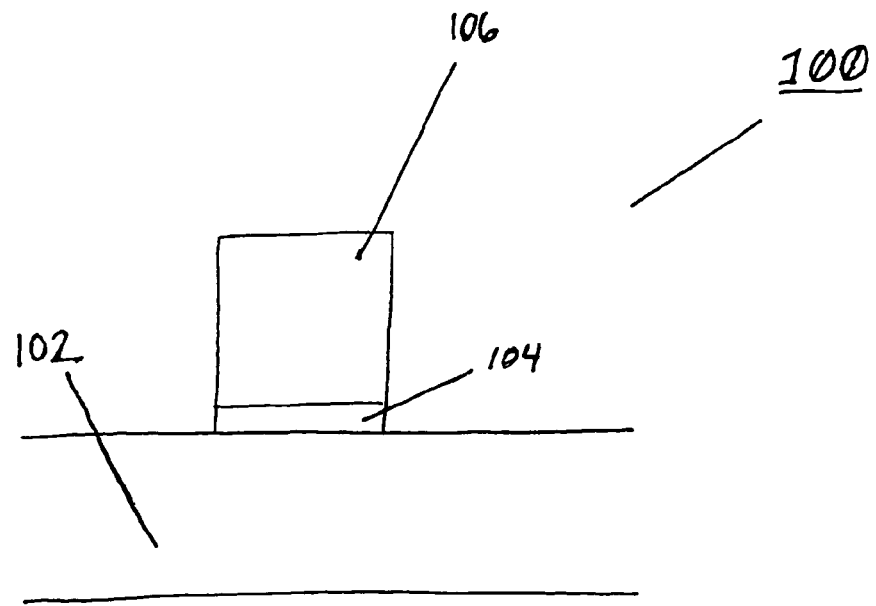
FIG. 1 is a cross sectional view illustrating a substrate with a dielectric and a gate electrode located on the substrate.

In one embodiment, a semiconductor device 100, FIG. 1, begins its manufacture with a substrate 102. Substrate 102 can be of a variety of materials, including but not limited to bulk silicon and silicon on insulator (SOI), SiGe, and other proper semiconductor materials. A gate dielectric 104 and a gate electrode 106 are formed on substrate 102. The dielectric 104 can be of a variety of materials, including but not limited to oxides and high K materials, which include materials with K values larger than approximately 5, such as SiON, $HfO_xSi_y$, or $HfO_2$, or a combination thereof. The gate electrode 106 may be a variety of materials, including but not limited to polysilicon. To create the gate electrode 106 on dielectric 104 on substrate 102 configuration shown in FIG. 1, the gate electrode 106 and dielectric 104 are patterned using conventional photolithographic and etching processing of suitable methods known in the art. For example, one method is by patterning the surface of underlying material with a sequential process, including photoresist patterning, dry etching, and photoresist stripping. Further, photoresist patterning includes processing steps of photoresist coating, softbaking, mask aligning, pattern exposing, photoresist development, and hard baking.

Figure 2:
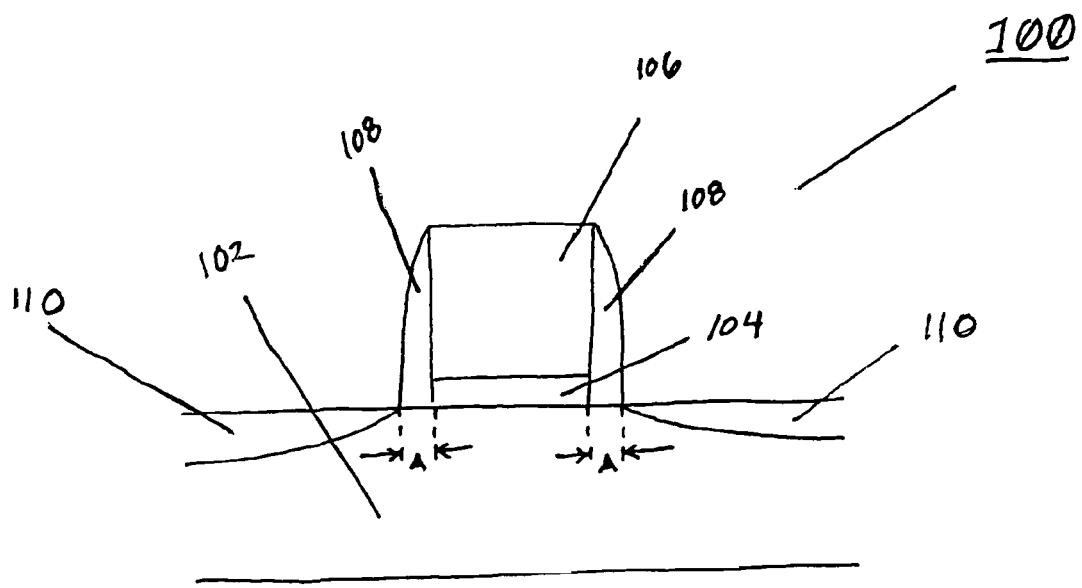
FIG. 2 is a cross sectional view illustrating an offset spacer adjacent the gate electrode and a light doping drain implanted in the substrate.

Once the gate electrode 106 and the dielectric 104 are formed, an offset spacer 108, FIG. 2, is formed. Offset spacer 108 can be of a variety of materials, including but not limited to oxides such as $SiO_2$. Offset spacer 108 can be formed using suitable methods known in the art, such as chemical vapor deposition followed by etching. Following the formation of offset spacer 108, an implantation may be used to form light doping drain (LDD) 110 in substrate 102. Light doping drain 110 is offset by a length, A, from gate electrode 106 and dielectric 104 due to offset spacer 108. For clarity, light doping drain 110 is omitted from subsequent figures.

Figure 3:
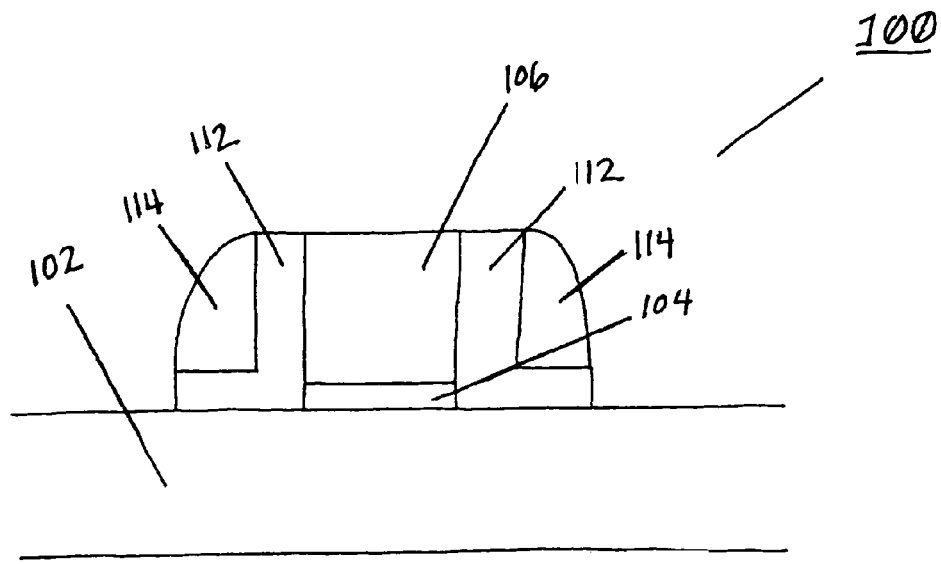
FIG. 3 is a cross sectional view illustrating a first spacer adjacent the gate electrode and a second spacer adjacent the first spacer.

A spacer 112, FIG. 3, is then formed on the substrate 102 adjacent gate electrode 106 and gate dielectric 104. Spacer 112 can be formed over offset spacer 108, resulting in offset spacer becoming part of spacer 112. A spacer 114 is formed adjacent spacer 112. Spacer 112 can be a variety of materials, including oxides such as $SiO_2$. Spacer 114 can be a variety of materials, including but not limited to SiON, $Si_3N_4$, SiC, or a composite made of a combination of two or more of the aforementioned materials. Spacer 112 and 114 can be formed using suitable methods known in the art, such as chemical vapor deposition followed by dry etching.

Figure 4:
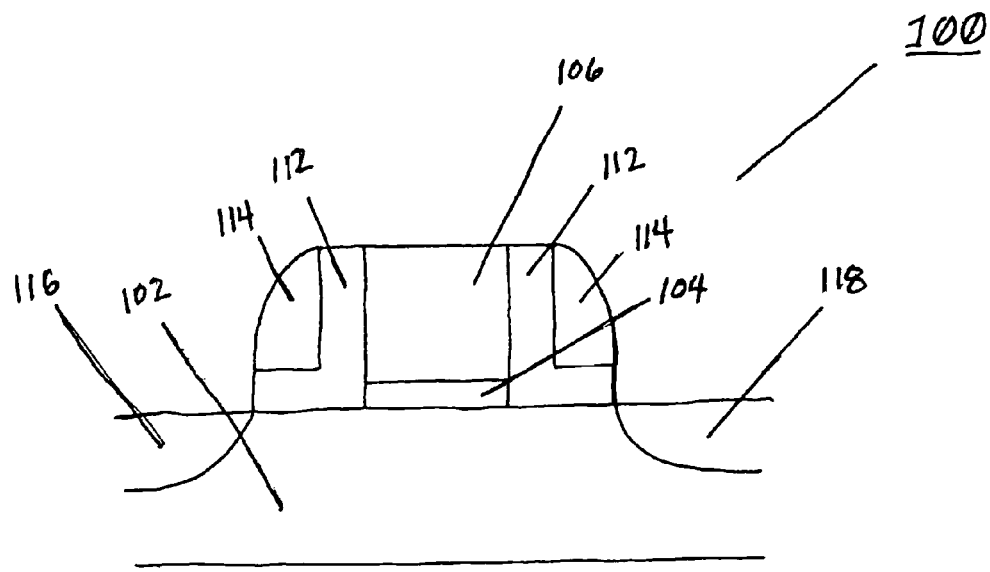
FIG. 4 is a cross sectional view illustrating a source and a drain implanted in the substrate.

Following spacer formation, a source 116, FIG. 4, and a drain 118 may be formed by doping such as implantation in substrate 102 and then annealing device 100.

Figure 5:
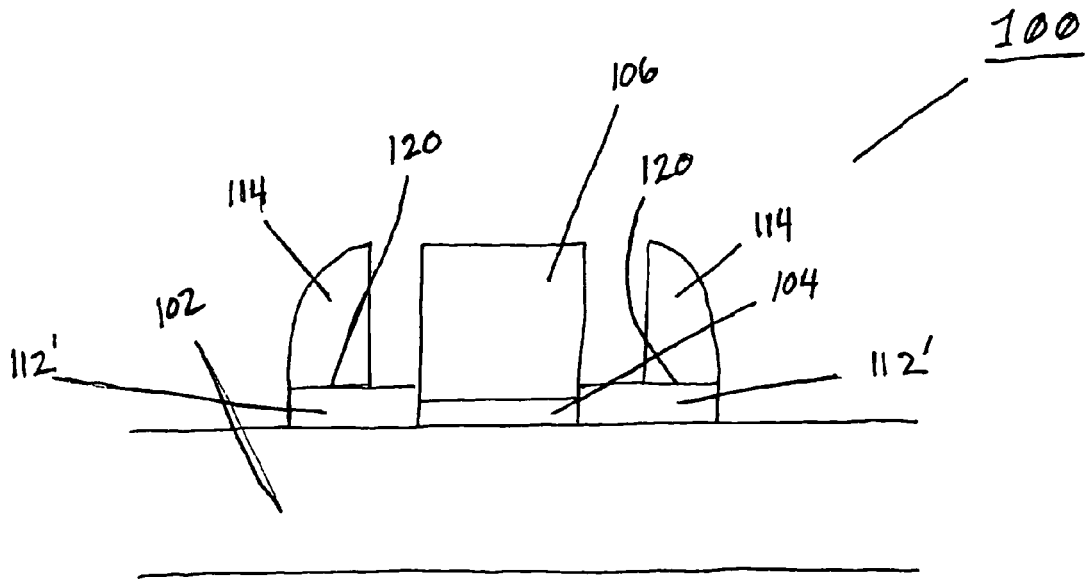
FIG. 5 is a cross sectional view illustrating the first spacer etched so that its top surface is substantially even with the bottom surface of the second spacer.

Spacer 112 is now etched, FIG. 5, removing portions of spacer 112 that were adjacent to gate electrode 106 and spacer 114, and forming spacer 112'. In this embodiment, spacer 112 has been etched to be substantially even with a bottom surface 120 of spacer 114.

Figure 6:
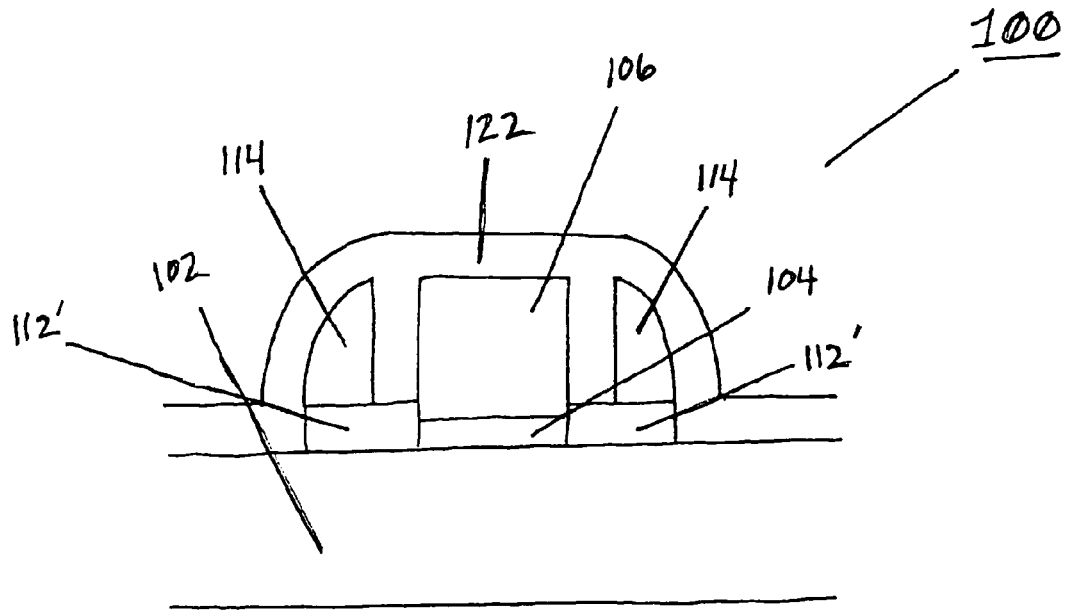
FIG. 6 is a cross sectional view illustrating a metal layer deposited on the device and in the space left after etching the first spacer.

A metal layer 122, FIG. 6, is then deposited on device 100. Metal layer 122 may be a metal or a metal alloy, including but not limited to Ni, Co, Mo, W, Ti, Ta or other similar alloys. Metal layer 122 can be deposited using suitable methods known in the art, such as chemical vapor deposition or physical vapor deposition. The amount of metal layer 122 deposited on device 100 must be sufficient to react with the gate electrode 106 in order to form a metal gate.

Figure 7:
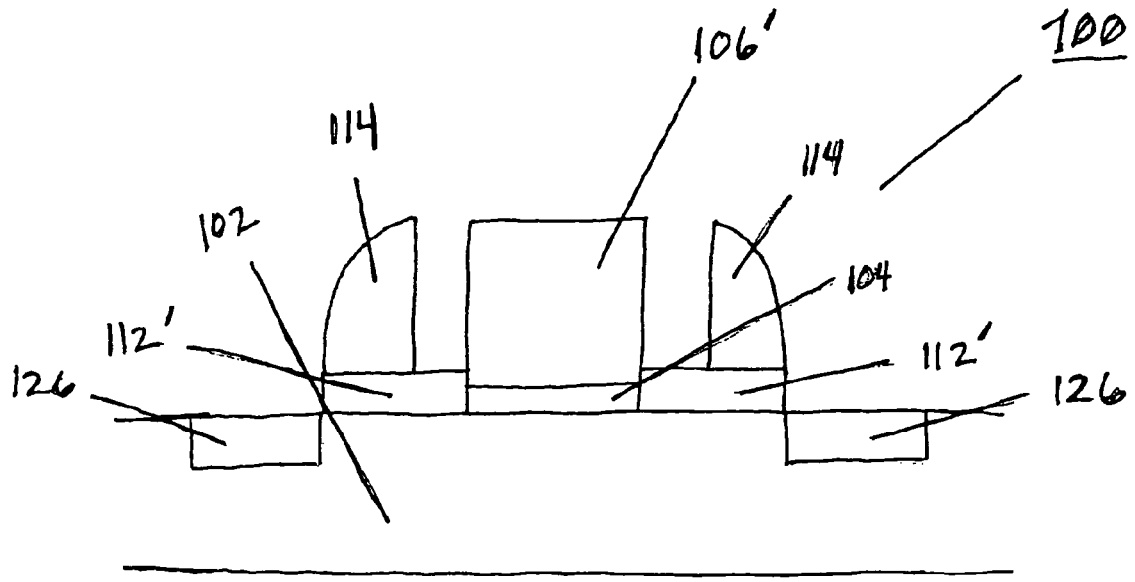
FIG. 7 is a cross sectional view illustrating the result of reacting the metal layer with the device to form a metal gate and a contact for the source and the drain, and then etching the unreacted metal layer.

The temperature of device 100 is then raised for a period of time, which causes metal layer 122 to react with gate electrode 106 to form a metal silicide gate ("metal gate") 106', FIG. 7. Temperature and time requirements will depend on the metal layer 122 and gate electrode 106 used. For a Ni metal layer and a polysilicon gate electrode, a temperature of 350 C-600 C for 10 seconds to 5 minutes is sufficient to form a NiSi gate. Metal layer 122 may also react with substrate 102 to form a contact 126 for source 116 and drain 118. Then unreacted metal may be etched away.

Figure 8:
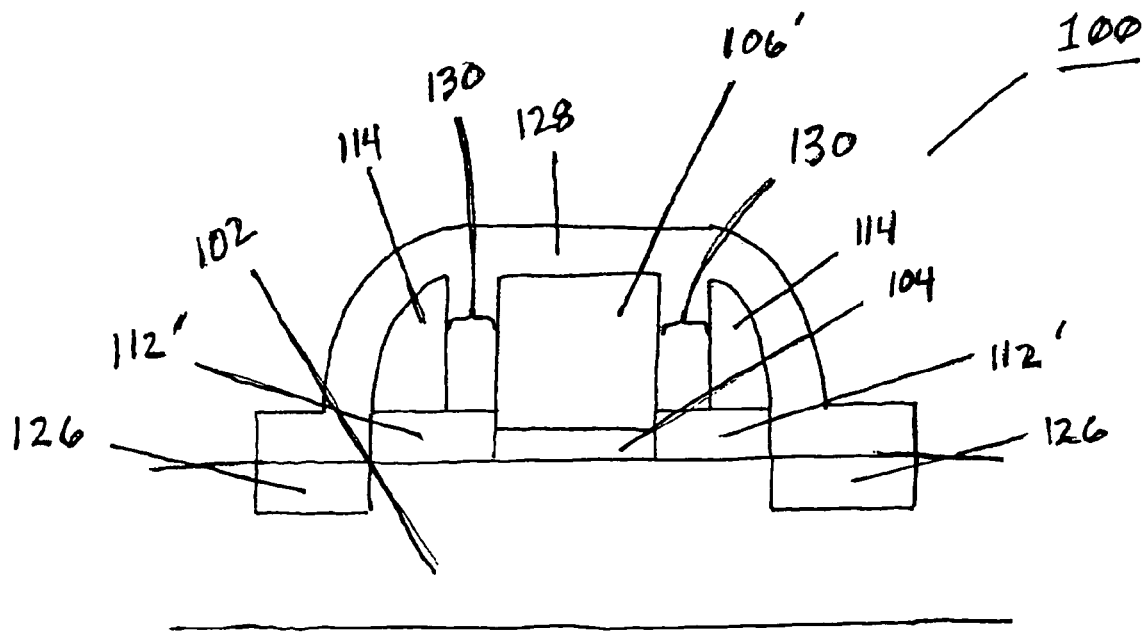
FIG. 8 is a cross sectional view illustrating a contact etch stop layer formed over the device.

After formation of metal gate 106', a layer 128, FIG. 8, is formed on device 100. Layer 128 can be made of a variety of materials, including but not limited to $Si_3N_4$, SiON, or a composite layer made of a combination of the aforementioned materials, and can be used as a contact etch stop layer. Layer 128 is formed using suitable methods known in the art, such as chemical vapor deposition.

With metal gate 106' and layer 128 formed, FIG. 8, device 100 includes metal gate 106' located on substrate 102, with gate dielectric 104 between metal gate 106' and substrate 102, and spacer 112' located on the substrate and adjacent metal gate 106', Spacer 114 is adjacent spacer 112', surrounds metal gate 106', and is spaced apart from metal gate 106' so as to form a region 130 between metal gate 106' and spacer 114. Layer 128 is located inside region 130 and outside region 130, covering the device 100.

The metal gate manufacturing method allows gate electrodes of different materials with different gate dielectric thicknesses to be formed. This allows high performance core devices, which can use thinner gate dielectrics to increase the performance, to be manufactured with other core devices and input/output devices, which can use thicker gate dielectrics that reduce gate leakage. A combination of different gate electrode materials and different gate dielectric thickness may be tuned to optimize the performance of NMOS and PMOS.

Figure 9:
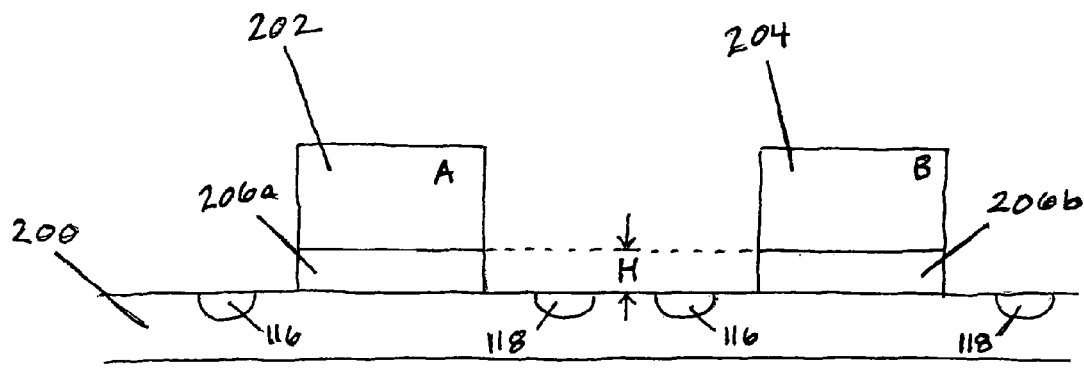
FIG. 9 is a cross sectional view illustrating a plurality of gates made of different materials formed on a substrate, each gate having substantially the same dielectric thickness.

In one embodiment, FIG. 9, a substrate 200 has a gate electrode 202 and a gate electrode 204 located on its surface. Substrate 200 can be made of a variety of materials, including but not limited to silicon or silicon on insulator. Each gate electrode 202 and 204 has a corresponding source 116 and drain 118 in the substrate 200. Gate electrode 202 has a dielectric 206a located between the gate electrode 202 and substrate 200. Gate electrode 204 has a dielectric 206b located between the gate electrode 204 and substrate 200. Dielectrics 206a and 206b can be made of a variety of materials, including but not limited to oxides and high K materials, which include materials with K values larger than approximately 5, such as SiON, $HfO_xSi_y$, or $HfO_2$. For clarity spacers, contacts, and other structures on the device have been omitted. Dielectrics 206a and 206b have substantially the same gate dielectric thickness H. Gate electrode 202 is made of a material A, which includes but is not limited to a variety of materials such as polysilicon, metal, a metal alloy, a metal silicide, or a composite layer made of a combination of two or more of the aforementioned materials. Gate electrode 204 is made of a material B, which is different from that of material A, and includes but is not limited to a variety of materials such as polysilicon, metal, a metal alloy, a metal silicide, or a composite layer made of a combination of two or more of the aforementioned materials.

Figure 10:
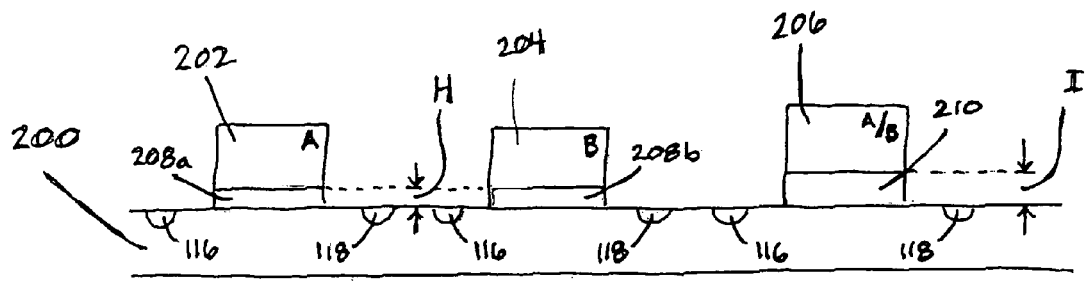
FIG. 10 is a cross sectional view illustrating a plurality of first gates made of different materials formed on a substrate, each gate having substantially the same dielectric thickness, and a second gate made of the same material one of the first gates formed on the substrate, the second gate have a dielectric thickness different than that of the first gates.

In another embodiment, FIG. 10, a substrate 200 has a gate electrode 202, a gate electrode 204, and a gate electrode 206 located on its surface. Substrate 200 can be made of a variety of materials, including but not limited to silicon or silicon on insulator. Each gate electrode 202, 204, and 206 has a corresponding source 116 and drain 118 implanted in the substrate 200. Gate electrode 202 has a dielectric 208a located between the gate electrode 202 and substrate 200. Gate electrode 204 has a dielectric 208b located between the gate electrode 204 and substrate 200. Gate electrode 206 has a dielectric 210 located between the gate electrode 206 and substrate 200. Dielectrics 208a, 208b, and 210 can be made of a variety of materials, including but not limited to oxides and high K materials, which include materials with K values larger than approximately 5, such as SiON, $HfO_xSi_y$, or $HfO_2$. For clarity spacers, contacts, and other structures on the device have been omitted. Dielectrics 208a and 208b have substantially the same gate dielectric thickness H. Dielectric 210 has a gate dielectric thickness I that is greater than that of gate dielectric thickness H. Alternatively, gate dielectric thickness I may be less than that of gate dielectric thickness H. Gate electrode 202 is made of a material A, which includes but is not limited to a variety of materials such as polysilicon, metal, a metal alloy, a metal silicide, or a composite layer made of a combination of two or more of the aforementioned materials. Gate electrode 204 is made of a material B, which is different from that of material A, and includes but is not limited to a variety of materials such as polysilicon, metal, a metal alloy, a metal silicide, or a composite layer made of a combination of two or more of the aforementioned materials. Gate electrode 206 is made of either material A or material B.

Figure 11:
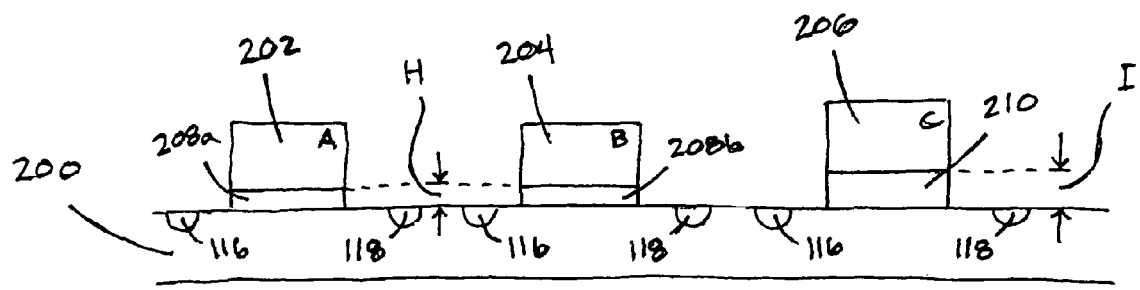
FIG. 11 is a cross sectional view illustrating a plurality of first gates made of different materials formed on a substrate, each gate having substantially the same dielectric thickness, and a second gate made of a different material than either one of the first gates formed on the substrate, the second gate have a dielectric thickness different than that of the first gates.

In another embodiment, FIG. 11, a substrate 200 has a gate electrode 202, a gate electrode 204, and a gate electrode 206 located on its surface. Substrate 200 can be made of a variety of materials, including but not limited to silicon or silicon on insulator. Each gate electrode 202, 204, and 206 has a corresponding source 116 and drain 118 implanted in the substrate 200. Gate electrode 202 has a dielectric 208a located between the gate electrode 202 and substrate 200. Gate electrode 204 has a dielectric 208b located between the gate electrode 204 and substrate 200. Gate electrode 206 has a dielectric 210 located between the gate electrode 206 and substrate 200. Dielectrics 208a, 208b, and 210 can be made of a variety of materials, including but not limited to oxides and high K materials, which include materials with K values larger than approximately 5, such as SiON, $HfO_xSi_y$, or $HfO_2$. For clarity spacers, contacts, and other structures on the device have been omitted. Dielectrics 208a and 208b have substantially the same gate dielectric thickness H. Dielectric 210 has a gate dielectric thickness I that is greater than that of gate dielectric thickness H. Alternatively, gate dielectric thickness I may be less than that of gate dielectric thickness H. Gate electrode 202 is made of a material A, which includes but is not limited to a variety of materials such as polysilicon, metal, a metal alloy, a metal silicide, or a composite layer made of a combination of two or more of the aforementioned materials. Gate electrode 204 is made of a material B, which is different from that of material A, and includes but is not limited to a variety of materials such as polysilicon, metal, a metal alloy, a metal silicide, or a composite layer made of a combination of two or more of the aforementioned materials. Gate electrode 206 is made of a material C, which is different from that of material A or B, and includes but is not limited to a variety of materials such as polysilicon, metal, a metal alloy, a metal silicide, or a composite layer made of a combination of two or more of the aforementioned materials.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A semiconductor device comprising:
   a substrate;
   a plurality of first gate electrodes located on the substrate;
   a first gate dielectric located between each first gate electrode and the substrate, the first gate dielectrics being substantially the same thickness;
   at least one of the first gate electrodes made of a first material;
   at least one of the first gate electrodes made of a second material which is different from the first material;
   at least one second gate electrode located on the substrate, the at least one second gate electrode being made of either the first material or the second material; and
   a second gate dielectric located between each at least one second gate electrode and the substrate, the second gate dielectrics having a thickness different from that of the first gate dielectrics.

2. The semiconductor device of claim 1 wherein the substrate is silicon on insulator.

3. The semiconductor device of claim 1 wherein the first material is polysilicon.

4. The semiconductor device of claim 1 wherein the second material is selected from the group consisting of a metal, a metal alloy, a metal silicide, and a combination thereof.

5. The semiconductor device of claim 1 wherein the second material includes a plurality of materials.

6. The semiconductor device of claim 1 wherein at least one gate dielectric is an oxide.

7. The semiconductor device of claim 1 wherein at least one gate dielectric is a high K material.

8. A semiconductor device comprising:
   a substrate;
   a metal gate electrode located on the substrate and having a top surface portion and a side surface portion; and
   a plurality of spacers, the plurality of spacers including a first spacer adjacent to the metal gate electrode and engaging the top surface portion and the side surface portion of the metal gate electrode, and including a second spacer adjacent to the first spacer;
   wherein the metal gate electrode is a metal silicide.

9. The semiconductor device of claim 8 wherein the first spacer or second spacer is selected from the group consisting of SiON, $Si_3N_4$, SiC, and a combination thereof.

10. A semiconductor device comprising:
    a substrate;
    a gate electrode located on the substrate;
    a first spacer surrounding the gate electrode and spaced apart from the gate electrode to form a first region therebetween; and
    a second spacer located both inside and outside of the first region.

11. The semiconductor device of claim 10 wherein the gate electrode is a metal silicide.

12. The semiconductor device of claim 10 wherein the first spacer or second spacer is selected from the group consisting of SiON, $Si_3N_4$, SiC, and a combination thereof.

13. A semiconductor device comprising:
    a substrate;
    a gate electrode located on the substrate;
    a first spacer located on the substrate and adjacent to the gate electrode;
    a second spacer located adjacent the first spacer, which surrounds the gate electrode and is spaced apart from the gate electrode to form a first region therebetween; and
    a third spacer located both inside and outside of the first region.

14. The semiconductor device of claim 13 wherein the gate electrode is a metal silicide.

15. The semiconductor device of claim 13 wherein the first spacer is $SiO_2$.

16. The semiconductor device of claim 13 wherein the second spacer or third spacer is selected from the group consisting of SiON, $Si_3N_4$, SiC, and a combination thereof.

17. The semiconductor device of claim 8,
    wherein the metal gate electrode includes a further side surface portion, the side surface portions being on opposite sides of the metal gate electrode and facing away from each other; and
    wherein the first spacer engages the top surface portion and both side surface portions of the metal gate electrode.

18. The semiconductor device of claim 10 wherein the second spacer engages both a surface portion of the first spacer facing the first region and a surface portion of the first spacer facing away from the first region.

19. The semiconductor device of claim 13 wherein the third spacer engages both a surface portion of the second spacer facing the first region and a surface portion of the second spacer facing away from the first region.

20. The semiconductor device of claim 13 wherein the entirety of the second spacer is vertically higher than the first spacer.

* * * * *